(12) United States Patent
Oyaizu et al.

(10) Patent No.: US 8,727,568 B2
(45) Date of Patent: May 20, 2014

(54) LIGHT-EMITTING APPARATUS AND ILLUMINATION APPARATUS

(75) Inventors: Tsuyoshi Oyaizu, Yokosuka (JP); Haruki Takei, Yokosuka (JP); Seiko Kawashima, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 336 days.

(21) Appl. No.: 13/193,032

(22) Filed: Jul. 28, 2011

(65) Prior Publication Data

US 2012/0026738 A1 Feb. 2, 2012

(30) Foreign Application Priority Data

Jul. 29, 2010 (JP) .................. 2010-171218

(51) Int. Cl.
F21S 4/00 (2006.01)

(52) U.S. Cl.
USPC .................. 362/249.02; 362/249.01; 313/498

(58) Field of Classification Search
USPC .................. 362/249.01, 249.02; 313/498, 512
See application file for complete search history.

(56) References Cited

U.S. PATENT DOCUMENTS

| | | |
|---|---|---|
| 2008/0224608 A1 | 9/2008 | Konishi |
| 2009/0184330 A1 | 7/2009 | Okimura |
| 2009/0207617 A1 | 8/2009 | Merchant |
| 2010/0025721 A1 | 2/2010 | Sakai |
| 2011/0044029 A1 | 2/2011 | Konishi |
| 2011/0063842 A1 | 3/2011 | Takei |
| 2011/0310609 A1 | 12/2011 | Kawashima |

FOREIGN PATENT DOCUMENTS

| | | |
|---|---|---|
| EP | 2295844 | 3/2011 |
| EP | 2397752 | 12/2011 |
| FR | 2922295 | 4/2009 |
| JP | 2005-209538 | 8/2005 |
| JP | 2008-227412 | 9/2008 |
| JP | 2010-027955 | 2/2010 |
| WO | WO 2009/150590 | 12/2009 |

OTHER PUBLICATIONS

European Search Report issued in EP 11175334.9 on Mar. 13, 2013.
English Language Abstract of FR 2922295 published Apr. 17, 2009.
English Language Abstract of JP 2008-227412 published Sep. 25, 2008.
English Language Translation of JP 2008-227412 published Sep. 25, 2008.
Japanese Office Action issued in JP 2010-171218 on Nov. 7, 2013.
English Language Translation of Japanese Office Action issued in JP 2010-171218 on Nov. 7, 2013.
English Language Abstract and Translation of JP 2005-209538 published on Aug. 4, 2005.

(Continued)

Primary Examiner — Vip Patel
(74) Attorney, Agent, or Firm — DLA Piper LLP (US)

(57) ABSTRACT

According to one embodiment, a light-emitting apparatus includes a substrate, an attachment member, and a mechanical fixing component. The substrate has light-emitting elements mounted on one surface side thereof. The attachment member includes a concave portion in which the substrate is arranged with a gap between the substrate and a side circumference of the concave portion. The mechanical fixing component includes a pressure portion that is in contact with the one surface side of the substrate, the mechanical fixing component being configured to hold the substrate in the concave portion of the attachment member by elastic pressing force of the pressure portion acting in a direction from the one surface side toward the other surface side of the substrate.

8 Claims, 9 Drawing Sheets

(56) References Cited

OTHER PUBLICATIONS

English Language Abstract and Translation of JP 2010-027955 published on Feb. 4, 2010.

European Office Action issued in EP 11175334.9 dated Nov. 7, 2013.

Chinese Office Action issued in CN 201110214236 on Aug. 5, 2013.

English Language Translation of Chinese Office Action issued in CN 201110214236 on Aug. 5, 2013.

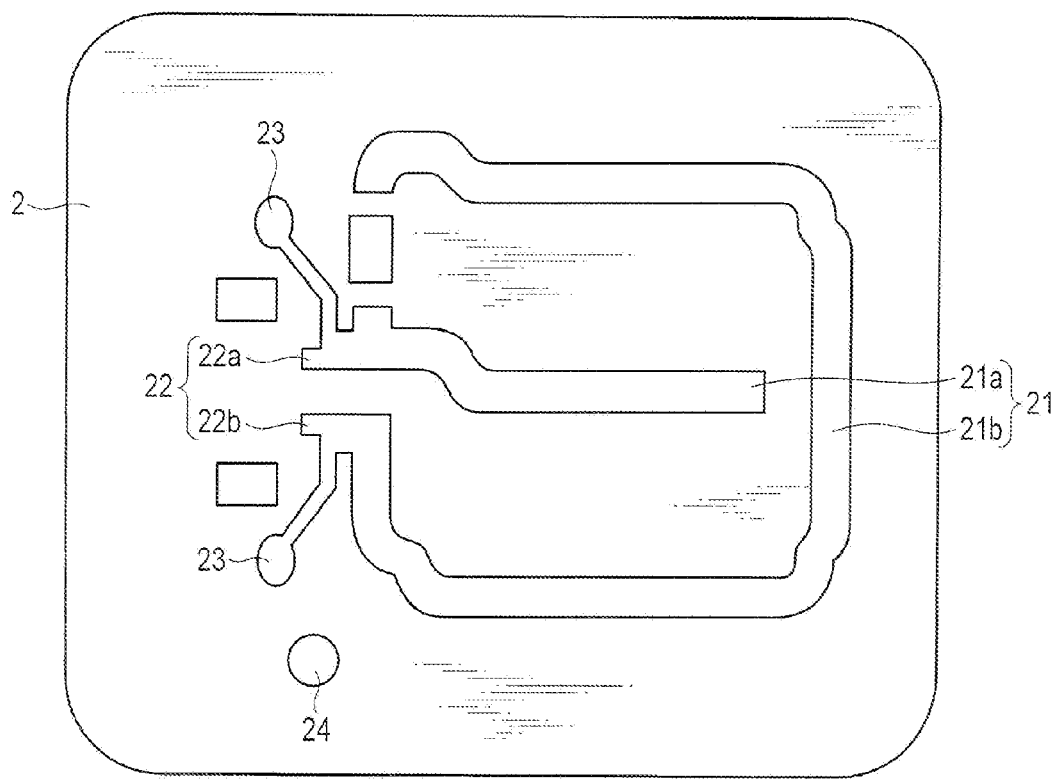
F I G. 2

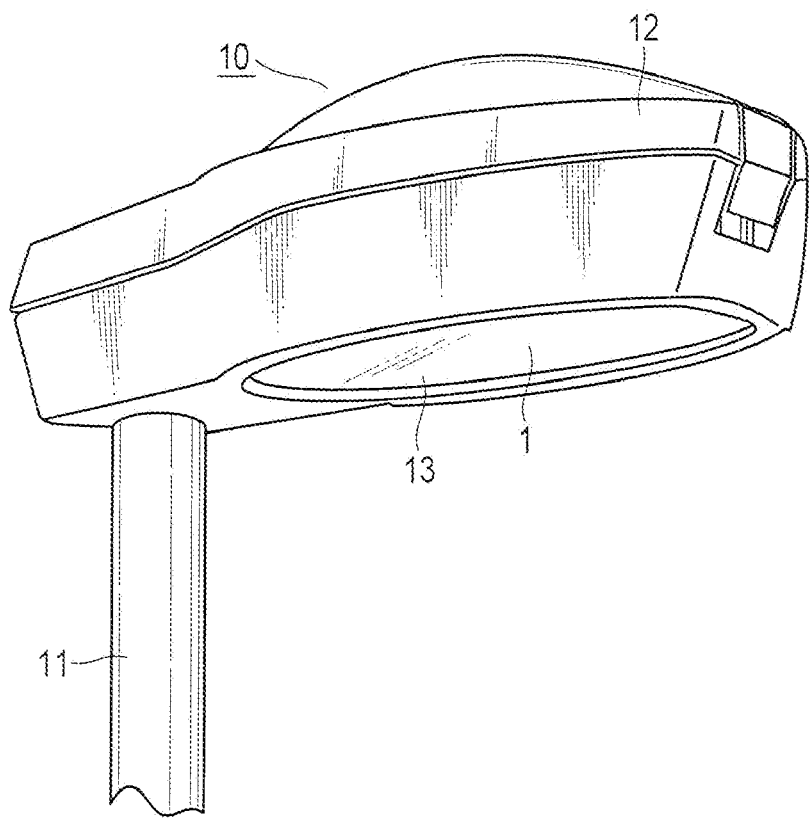
F I G. 10

US 8,727,568 B2

LIGHT-EMITTING APPARATUS AND ILLUMINATION APPARATUS

CROSS-REFERENCE TO RELATED APPLICATIONS

This application is based upon and claims the benefit of priority from prior Japanese Patent Application No. 2010-171218, filed Jul. 29, 2010, the entire contents of which are incorporated herein by reference.

FIELD

Embodiments described herein relate generally to a light-emitting apparatus using light-emitting elements like LEDs and an illumination apparatus including this light-emitting apparatus.

BACKGROUND

An LED is used as a light source of an illumination apparatus. This light source is constituted as a light-emitting apparatus in which bare chips of many LEDs are mounted on a substrate, the respective LED chips are electrically connected to each other through bonding wires, and the substrate is fixed to an attachment member by fixing components such as screws.

In recent years, in such a light-emitting apparatus, a high output has been demanded. To realize this high output, a current supplied to the LEDs must be increased. However, when the current to be supplied is increased, a temperature of the LEDs rises, and the LEDs are operated at a high temperature. In consequence, a temperature of the substrate is also increased, and hence a difference between thermal expansion and contraction of the substrate becomes large in a thermocycle of on/off of the LEDs.

In the above-described configuration, when the substrate is fixed to the attachment member with fixing components such as screws, stress is applied to the substrate because of a difference in heat characteristics such as a difference in thermal expansion coefficient between the substrate and the attachment member. As a result, the substrate may be deformed or cracked, whereby the substrate may be possibly damaged.

BRIEF DESCRIPTION OF THE DRAWINGS

FIG. 2 is a plan view showing a wiring pattern on a substrate in the light-emitting apparatus;
FIG. 10 is a perspective view showing an illumination apparatus according to an embodiment.

DETAILED DESCRIPTION

Figure 1:
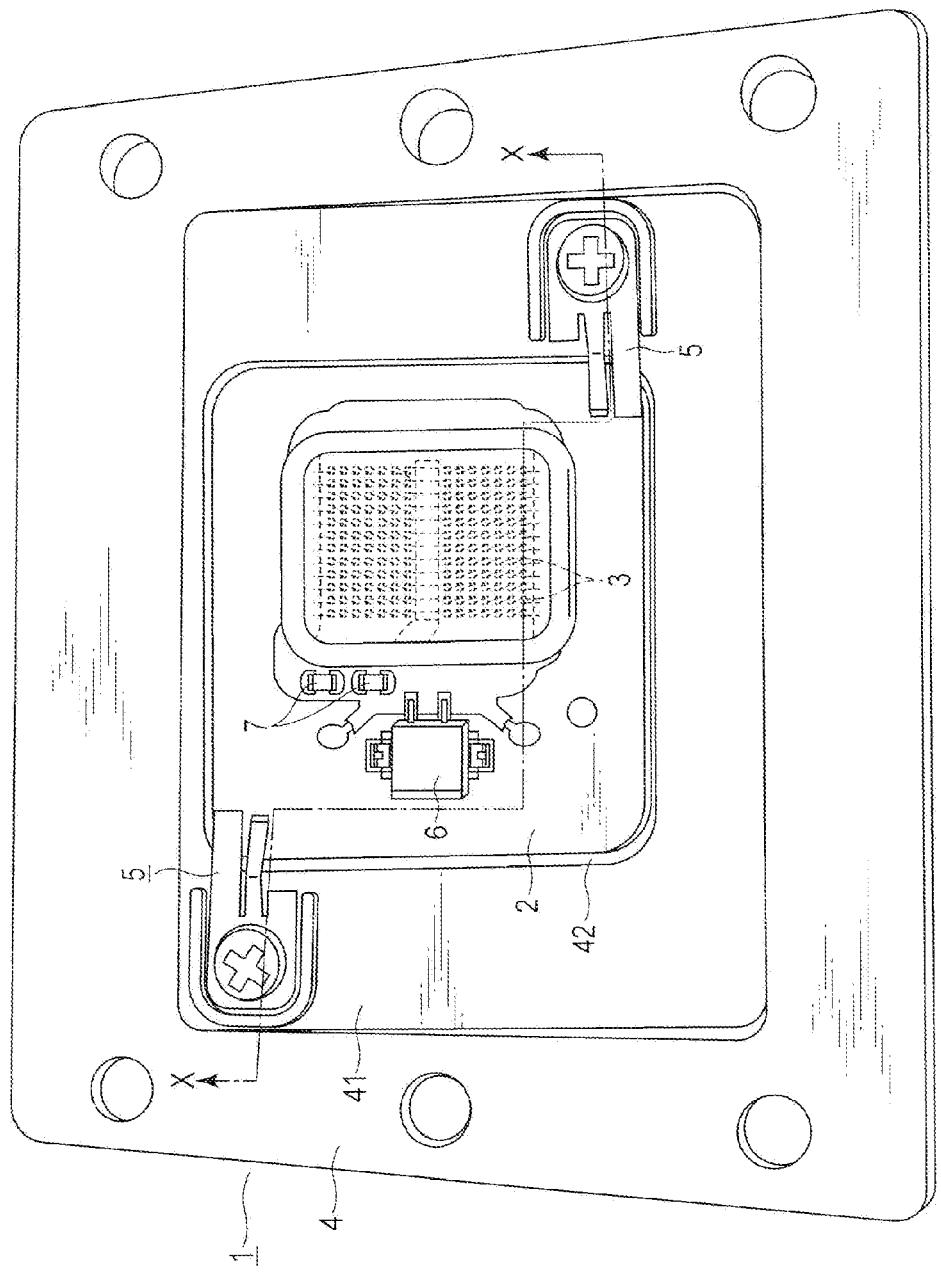
FIG. 1 is a perspective view showing a light-emitting apparatus according to an embodiment.

In general, according to one embodiment, a light-emitting apparatus comprises a substrate, an attachment member, and a mechanical fixing component. The substrate has light-emitting elements mounted on one surface side thereof. The attachment member comprises a concave portion in which the substrate is arranged with a gap between the substrate and a side circumference of the concave portion. The mechanical fixing component comprises a pressure portion that is in contact with the one surface side of the substrate, the mechanical fixing component being configured to hold the substrate in the concave portion of the attachment member by elastic pressing force of the pressure portion acting in a direction from the one surface side toward the other surface side of the substrate.

A light-emitting apparatus according to an embodiment will now be described with reference to FIG. 1 to FIG. 9. It is to be noted that like reference numerals denote like parts to omit an overlapping description.

Figure 7:
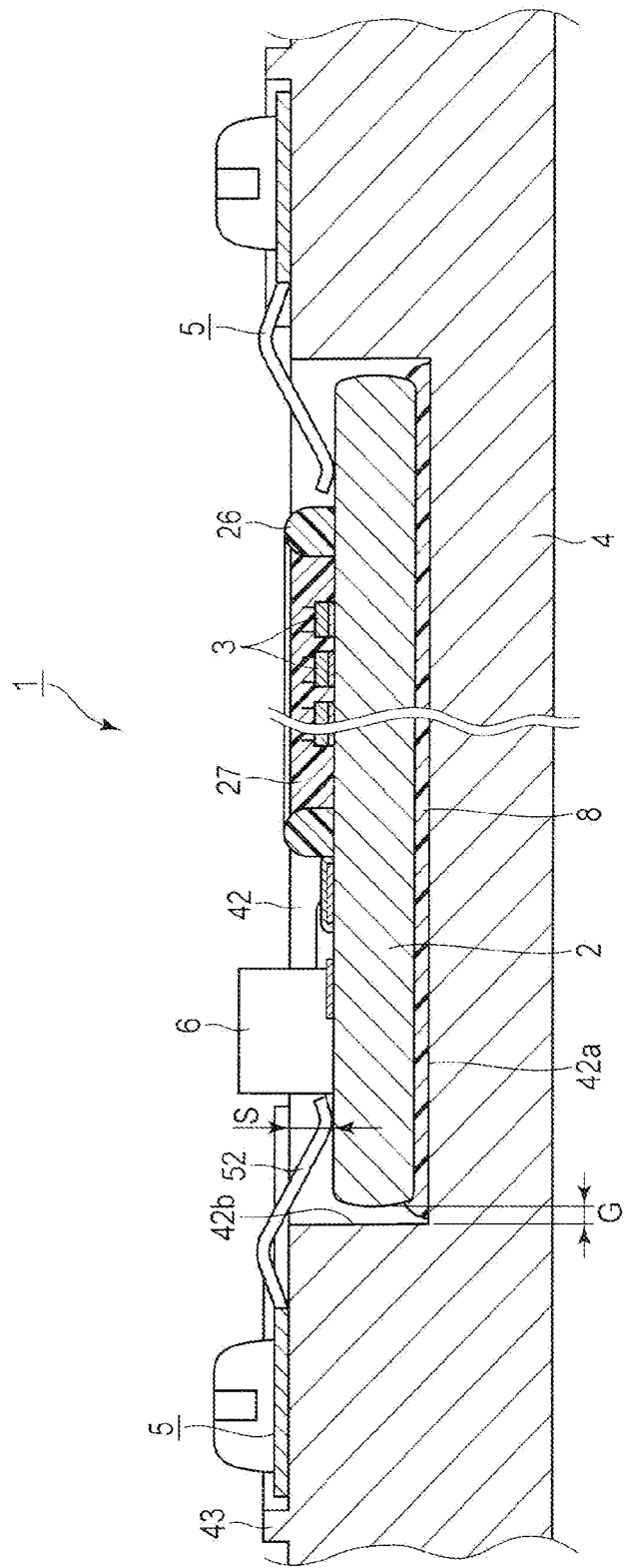
FIG. 7 is a cross-sectional view of the light-emitting apparatus taken along line X-X in FIG. 1.

As representatively shown in FIG. 1 and FIG. 7, a light-emitting apparatus 1 comprises a substrate 2, light-emitting elements 3, an attachment member 4, and mechanical fixing components 5. The light-emitting elements 3 are mounted on a front surface side which is one surface side of the substrate 2. The substrate 2 is arranged on the attachment member 4. The mechanical fixing components 5 hold the substrate 2 on the attachment member 4.

The substrate 2 has insulating properties, and it is made of a ceramics material like a whitish aluminum oxide or aluminum nitride. The substrate 2 is formed into a substantially square shape which is a polygonal shape. Each corner portion of the substrate has a circular shape.

It is to be noted that a boron nitride, a silicon nitride, a magnesium oxide, forsterite, steatite, low-temperature sintering ceramics, and others can be applied as the material of the substrate 2, and the substrate 2 is not restricted to a specific material in particular. Further, the shape of the substrate 2 is not restricted to the square shape, it may be any other polygonal shape such as a circular shape or a hexagonal shape, and the shape can be appropriately selected in accordance with design.

As shown in FIG. 2, a wiring pattern is formed on the front surface side of the substrate 2. This wiring pattern is constituted of a feed conductor 21 and a feed terminal 22. The feed conductor 21 is constituted of a positive-electrode-side feed conductor 21a and a negative-electrode-side feed conductor 21b. The feed terminal 22 is constituted of a positive-electrode-side feed terminal 22a and a negative-electrode-side feed terminal 22b.

The positive-electrode-side feed conductor 21a is formed to linearly extended at a central portion on the surface of the substrate 2. The positive-electrode-side feed terminal 22a is formed at one end portion (a left-hand side in the drawing) of the positive-electrode-side feed conductor 21a to be continuous with the positive-electrode-side feed conductor 21a.

The negative-electrode-side feed conductor 21b is formed into a square shape to surround the positive-electrode-side feed conductor 21a. The positive-electrode-side feed conductor 21a is placed at a central portion of the negative-electrode-side feed conductor 21b. The positive-electrode-side feed terminal 22a is formed at one end portion (a lower left side in the drawing) of the positive-electrode-side feed conductor 21a to be continuous with the positive-electrode-side feed conductor 21a.

It is to be noted that, although the detailed description will be omitted, lighting inspection conductors 23 for a lighting confirmation test, a temperature inspection conductor 24 for temperature measurement, and the like are formed on the surface of the substrate 2.

Each of the feed conductor 21 and the feed terminal 22 is formed by, for example, screen-printing silver (Ag) or an alloy containing silver (Ag) as a main component on the substrate 2. It is to be noted that each of the feed conductor 21 and the feed terminal 22 may be formed by plate processing in place of screen printing. Furthermore, a metal having excellent conductivity such as copper (Cu) or gold (Au) can be applied as this formation material.

Figure 3:
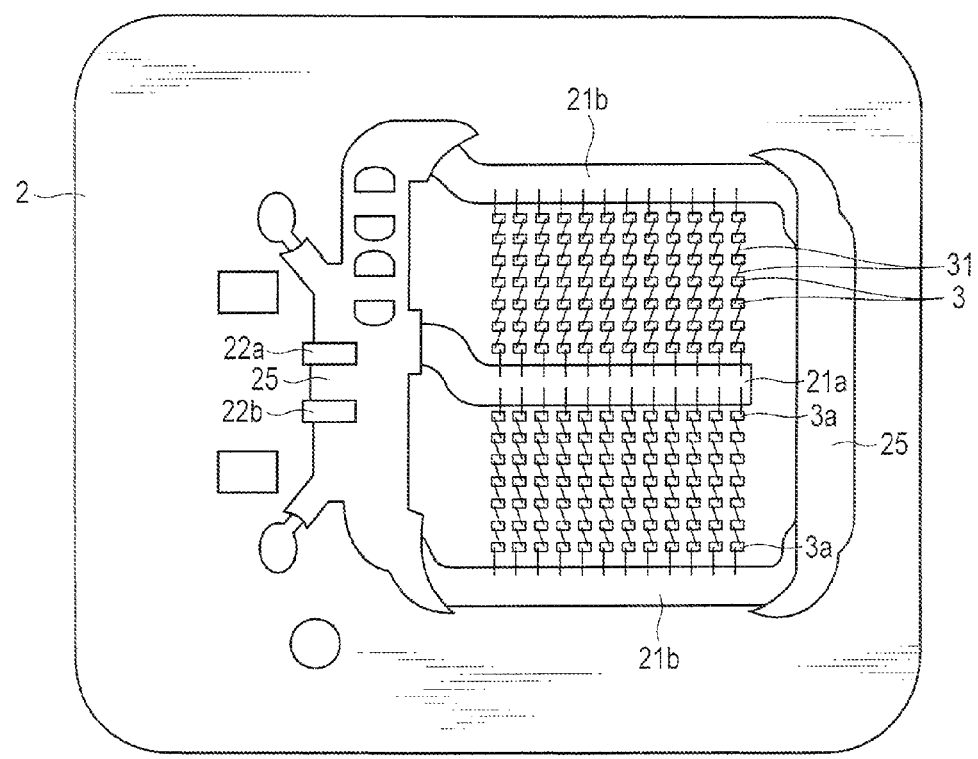
FIG. 3 is a plan view showing a state that light-emitting elements are mounted on the substrate in the light-emitting apparatus.

As representatively shown in FIG. 3, a protective layer 25 made of an electric insulating material consisting of, for example, glass paste is partially (both left and right sides in the drawing) formed in the wiring pattern. This protective layer 25 is formed by the screen printing. The protective layer 25 is configured to mainly cover portions of the feed conductor 21 and the feed terminal 22 that are not sealed by a later-described sealing member 27. As a result, deterioration of the feed conductor 21 and the feed terminal 22 can be suppressed.

The light-emitting elements 3 are mounted on the surface of the substrate 2. The light-emitting element 3 is constituted of a bare chip of an LED, and it is directly bonded to the surface of the substrate 2. As the bare chip of the LED, for example, a material that emits blue light is used in order to emit whitish light by a light-emitting portion.

As shown in FIG. 3, these light-emitting elements 3 are aligned in a matrix form with the positive-electrode-side feed conductor 21a at the boundary, thereby forming strings (light-emitting element strings).

The bare chip of the LED is, for example, an InGaN-based element obtained by laminating a light-emitting layer on a translucent sapphire element substrate. The light-emitting layer is formed into a substantially rectangular parallelepiped shape by sequentially laminating an n-type-nitride semiconductor layer, an InGaN light-emitting layer, and a p-type-nitride semiconductor layer. Moreover, an electrode configured to pass a current through the light-emitting layer is provided on an upper surface side. This electrode is constituted of a positive-side electrode formed of a p-type electrode pad on the p-type-nitride semiconductor layer and a negative-side electrode formed of an n-type electrode pad on the n-type-nitride semiconductor layer. These electrodes are electrically connected to each other through a bonding wire 31. The bonding wire 31 is formed of a gold (Au) fine wire. Each bonding wire 31 is connected through a bump containing gold (Au) as a main component in order to improve mounting strength and reduce damage to the bare chip of each LED. It is to be noted that a metal fine wire such as a copper wire, an aluminum wire, or a platinum wire can be applied as the bonding wire 31.

Specifically, the bare chips of the LEDs form the light-emitting element strings in a direction extending toward the negative-electrode-side feed conductor 21b facing the positive-electrode-side feed conductor 21a with the positive-electrode-side feed conductor 21 at the boundary. Therefore, in the drawing, the bare chips of the LEDs form an upper matrix block and a lower matrix block.

In each light-emitting element string, electrodes with different polarities of the respective light-emitting elements adjacent to each other in a direction along which the string extends, i.e., the positive-side electrode of the one light-emitting element 3 in the light-emitting elements 3 adjacent to each other and the negative-side electrode of the other light-emitting element 3 in the light-emitting elements 3 adjacent to each other are sequentially connected through the bonding wire 31. As a result, the light-emitting elements 3 constituting each light-emitting element string are electrically connected in series.

Additionally, in each light-emitting element string, the electrode of each light-emitting element 3a arranged at an end of a specific light-emitting element string is connected to the positive-electrode-side feed conductor 21a or the negative-electrode-side feed conductor 21b through the bonding wire 31. Therefore, seven light-emitting elements 3 are connected in series in one light-emitting string. The 12 light-emitting element strings are formed in the upper matrix block. Likewise, the 12 light-emitting element strings are formed in the lower matrix block. Therefore, 24 series circuits, each of which has the seven light-emitting elements 3 connected in series, are connected in parallel, whereby the light-emitting elements 3 are operated to simultaneously emit light in an energized state. Therefore, even if any string in the respective light-emitting element strings cannot emit light because of, for example, a bonding failure, light emission of the entire light-emitting apparatus 1 is not stopped.

Figure 4:
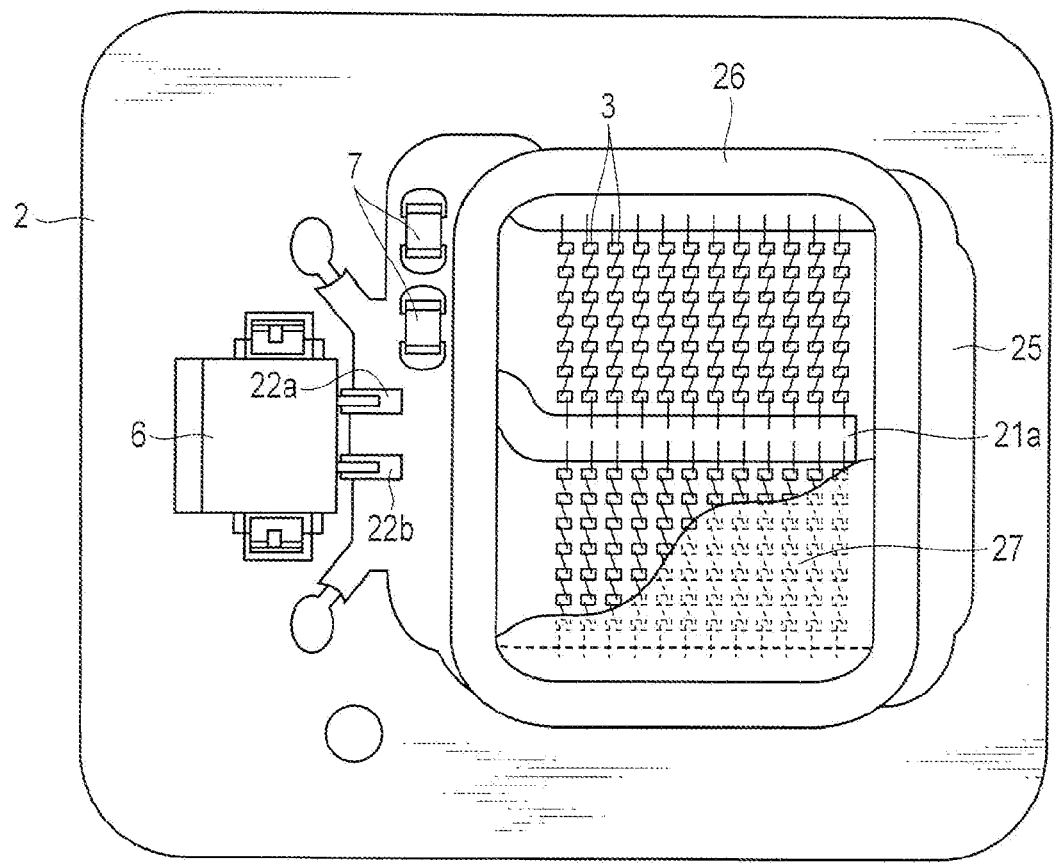
FIG. 4 is a partially cutaway plan view showing a completed state of the substrate in the light-emitting apparatus.

As shown in FIG. 4, a frame member 26 is provided on the surface of the substrate 2. This frame member 26 is made of a white synthetic resin and applied in a substantially square shape. The respective light-emitting elements 3 are arranged on the inner side of the frame member 26 surrounded by an inner peripheral surface of the frame member 26. That is, a mounting region of the light-emitting elements 3 is surrounded by the frame member 26.

The inner side of the frame member 26 is filled with the sealing member 27. The sealing member 27 is provided on the substrate 2. The sealing member 27 is, for example, a translucent synthetic resin like a transparent silicone resin, and it seals the mounting region of the light-emitting elements 3.

Further, the sealing member 27 contains an appropriate amount of a fluorescent material. The fluorescent material is excited by light emitted from the light-emitting elements 3, and it radiates light having a color different from that of the light emitted from the light-emitting elements 3. In this embodiment that the light-emitting elements 3 emit blue light, to enable emission of white light, a yellow fluorescent material that radiates yellowish light is used as the fluorescent material. The yellowish light has a complementary color relationship with the blue light. A predetermined amount of the sealing member 27 is injected into the inner side of the frame member 26 in an unhardened state, and then the sealing member 27 is heat-hardened and provided in this state.

Furthermore, a connector 6 and two capacitors 7 are mounted on the surface of the substrate 2. The connector 6 has a white synthetic resin case having less light absorption properties. A pair of terminal pins are protruded from one side surface of the case. The terminal pins are soldered and electrically connected to the positive-electrode-side feed terminal 22a and the negative-electrode-side feed terminal 22b. Moreover, a lead wire connected to a power supply side is connected to this connector 6. As a result, electric power is supplied to the respective light-emitting elements 3 through the connector 6.

The capacitors 7 function to prevent noise from being superimposed on a power supply and then being applied to the respective light-emitting elements 3.

Figure 5:
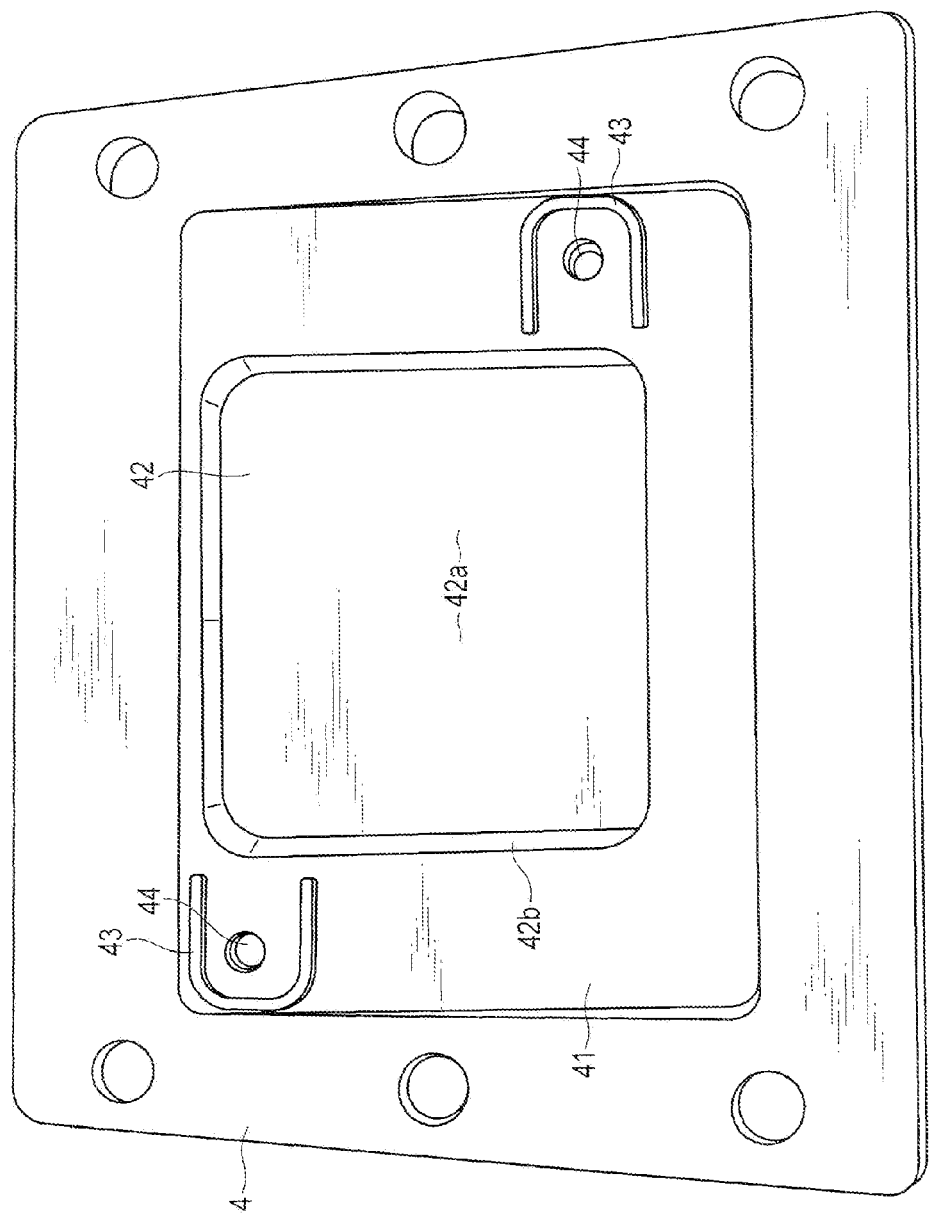
FIG. 5 is a perspective view showing an attachment member of the light-emitting, apparatus.

The thus configured substrate 2 is disposed to the attachment member 4 depicted in FIG. 5. The attachment member 4 is made of, for example, an aluminum material having excellent heat conduction. The attachment member 4 has a square shape which is a polygonal shape. Each corner portion of the attachment member 4 has a circular shape. The attachment member 4 has a slightly inclined arrangement surface 41 for the substrate 2 at the central portion thereof. A concave portion 42 having a substantially square shape in which the substrate 2 is installed is formed in this arrangement surface 41. A bottom surface 42a of this concave portion 42 is formed into a flat shape. A side surface 42b of the concave portion 42 is formed to erect from the circumference of the bottom surface 42a. The concave portion 42 has a shape substantially similar to the outer shape of the substrate 2 and is formed to be slightly larger than the substrate 2. Moreover, substantially-U-shaped positioning protruding portions 43 and screw holes 44 at which the later-described mechanical fixing components 5 are arranged are formed on a diagonal line of the concave portion 42.

Additionally, screw through-holes used for fixing this attachment member 4 to, for example, a main body of an illumination apparatus are formed on both sides of the attachment member 4. It is to be noted that this attachment member 4 may be, for example, a heat sink, a main body of an apparatus, a case, or a cover. In short, this means a member to which the substrate 2 is disposed.

As shown in FIG. 1 and FIG. 7, the substrate 2 is positioned and arranged with the concave portion 42 of the attachment member 4 being used as a guide. The substrate 2 is disposed in such a manner that its back surface side which is the other surface side is appressed against the bottom surface 42a of the attachment member 4. That is, the mechanical fixing components 5 give elastic pressing force in a direction extending from the front surface side toward the back surface side of the substrate 2, thereby disposing the substrate 2. It is to be noted that the concave portion 42 has the shape substantially similar to the outer shape of the substrate 2 and is formed to be slightly larger than the substrate 2, and hence positioning of the substrate 2 can be facilitated.

The mechanical fixing component 5 is a fixing member having a leaf spring shape. The mechanical fixing component 5 is positioned to each positioning protruding portion 43 from the front surface (upper surface) side of the attachment member 4. The mechanical fixing component 5 is configured to be fixed on the front surface of the attachment member 4 by a fixing component such as a screw. Therefore, the pair of mechanical fixing components 5 are arranged on the substantially diagonal line of the substrate 2.

Figure 6:
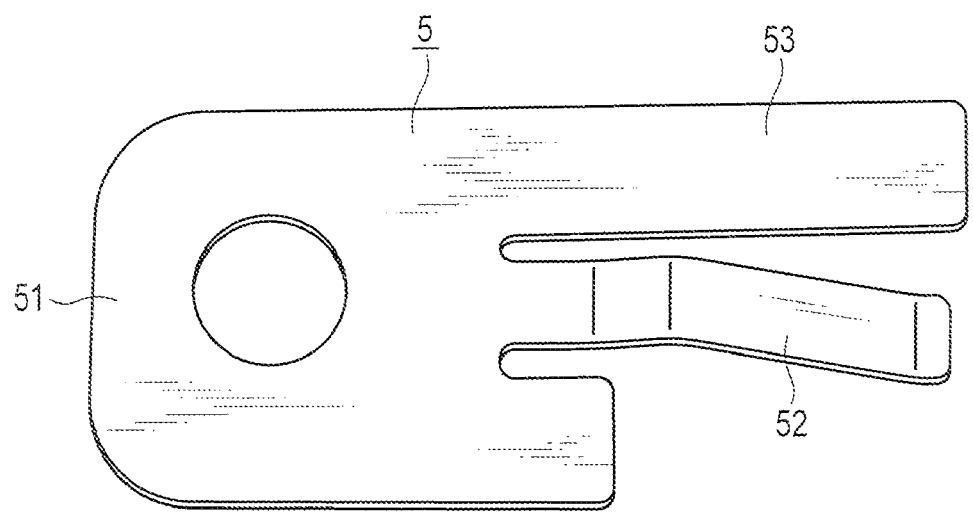
FIG. 6 is a perspective view showing the mechanical fixing component.

As representatively shown in FIG. 6, the fixing member 5 is made of a metal plate-like material. This fixing member 5 is made of stainless steel having elasticity. This fixing member 5 has a base portion 51, a pressure portion 52, and a protective portion 53. The base portion 51 has a predetermined width dimension, and a through-hole in which fixing component such as a screw is inserted is formed in the base portion 51. The pressure portion 52 having a narrow width is extended from a substantially central portion of this base portion 51. In the drawing, this pressure portion 52 is formed to be bent in order to apply elastic pressing force in a page space direction. An end side of the pressure portion 52 is configured to come into contact with the front surface side of the substrate 2.

Furthermore, the protective portion 53 is extended parallel to the pressure portion 52. The protective portion 53 has a width larger than that of the pressure portion 52 and is linearly extended. This protective portion 53 can be gripped when handling the fixing member 5 in an assembling operation and the like. The protective portion 53 has a function of avoiding, for example, deformation of the pressure portion 52 when external force is applied thereto and also protecting the pressure portion 52. If the protective portion 53 is not provided, the pressure portion 52 is gripped and handled, and inconvenience, for example, the deformation of the pressure portion 52 may possibly occur.

It is to be noted that forming an extended length dimension of the protective portion 53 to be equal to or longer than an extended length dimension of the pressure portion 52 is preferable. As a result, the pressure portion 52 is assuredly protected.

As shown in FIG. 7, in a state that the substrate 2 is arranged in the concave portion 42 and held by the mechanical fixing components 5, a gap G is formed between a side periphery of the substrate 2 and the side surface 42b of the concave portion 42. Specifically, the gap G of approximately 1 mm is formed over the whole circumference of the substrate 2.

It is to be noted that a dimension of this gap G is not restricted in particular. Moreover, it is preferable for the gap G to be uniform over the whole circumference of the substrate 2, but the gap G does not have to be necessarily uniform. For example, a part of the side circumference of the substrate 2 may be in contact with the side surface 42b of the concave portion 42. In short, when the substrate 2 can move in the horizontal direction as will be described later, providing the gap G that can absorb thermal expansion of the substrate 2 can suffice. Additionally, an elastic material such as a cushion member may be interposed in this gap G. In such a case, the thermal expansion of the substrate 2 can be likewise absorbs.

Further, the mechanical fixing components 5 are disposed on the front surface side corresponding to a higher position than the bottom surface 42a of the concave portion 42 in the attachment member 4. Each pressure portion 52 is in contact with the one surface side of the substrate 2 at a position on the bottom surface 42a side of the concave portion 42 apart from the front surface side of the attachment member 4. That is, in a state that the fixing member 5 is being fixed to the attachment member 4, the end side of each pressure portion 52 is in contact with the front surface of the substrate 2 to have a step S on a lower side (the concave portion 42 side) of the upper surface of the attachment member 4. Therefore, the elastic pressing force of each pressure portion 52 effectively acts on the front surface of the substrate 2, and predetermined elastic pressing force can be maintained across the age. Furthermore, it is possible to reduce application of excessive stress to a part of the fixing member 5 fixed by, for example, a screw. As a result, the elastic pressing force of the pressure portion 52 of the fixing member 5 in the direction from the front surface side to the back surface side of the substrate 2 is applied to the substrate 2, thereby holding the substrate 2 on the attachment member 4.

It is preferable to set the elastic pressing force (an elastic load) of the mechanical fixing components 5 to 180 g to 350 g. This elastic pressing force (the elastic load) can be realized by setting the step S to 0.1 mm to 0.6 mm. That is, the elastic pressing force (the elastic load) is increased when the step S is small, and the elastic pressing force (the elastic load) is reduced when the step S is large.

Figure 8:
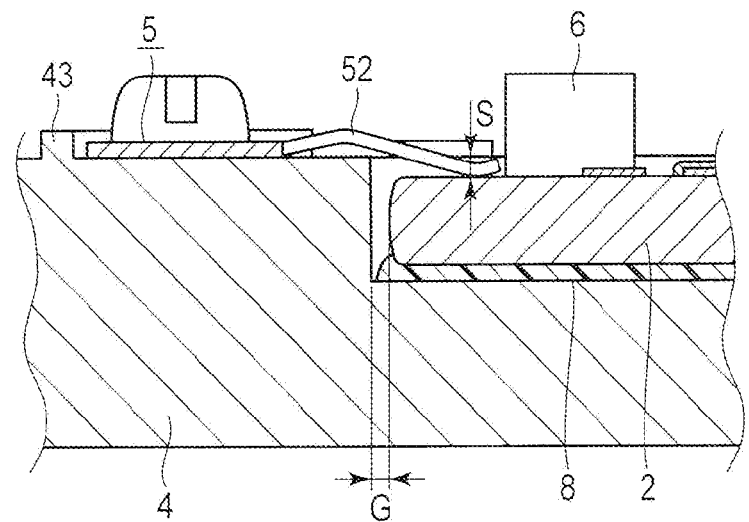
FIG. 8 is a cross-sectional view showing a part of a modification in a fixed state of the substrate.
Figure 9:
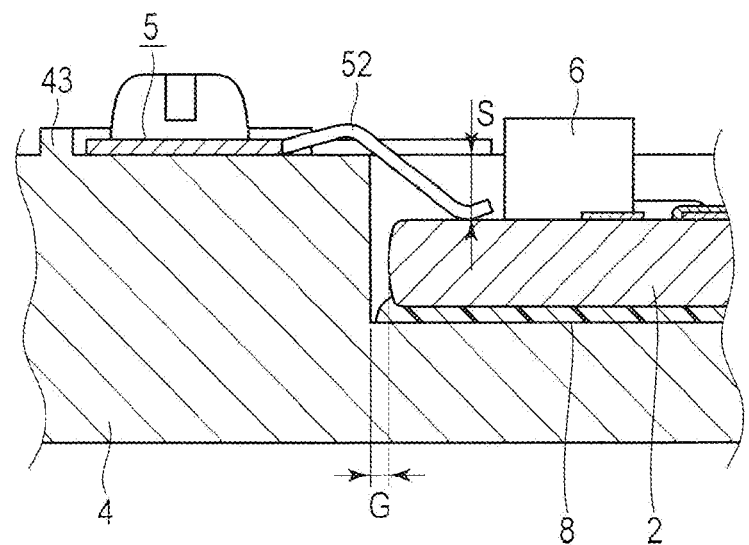
FIG. 9 is a cross-sectional view likewise showing a part of a modification in the fixed state of the substrate.

FIG. 8 and FIG. 9 show examples when the dimension of the step S is adjusted to set the elastic pressing force (the elastic load). In FIG. 8, the dimension of the step S is reduced, whereby the elastic pressing force (the elastic load) is set to 350 g. In this case, the dimension of the step S is adjusted to, for example, 0.1 mm. In FIG. 9, the dimension of the step S is increased, whereby the elastic pressing force (the elastic load) is set to 180 g. In this case, the dimension of the step S is adjusted to, for example, 0.6 mm.

In these cases, although a depth dimension of the concave portion 42 is coordinated to adjust the dimension of the step S, the adjustment is not restricted to this conformation. For example, the dimension of the step S can be likewise adjusted by, for example, coordinating a thickness dimension of the substrate 2. When the dimension of the step S is adjusted in this manner, the elastic pressing force (the elastic load) can be appropriately set in accordance with design.

Moreover, a thermally conductive member 8 is interposed between the back surface side of the substrate 2 and the bottom surface 42a of the concave portion 42. As a result, adhesion of the substrate 2 and the bottom surface 42a of the concave portion 42 can be improved, and heat from the substrate 2 can be conducted to the attachment member 4, thereby facilitating heat radiation. Specifically, the thermally conductive member 8 is grease having predetermined viscosity and flowability, and it is provided by being applied to the bottom surface 42a of the concave portion 42.

When electric power is supplied to the thus configured light-emitting apparatus 1 by a lighting circuit, energization is carried out from the connector 6 through the positive-electrode-side feed terminal 22a, the positive-electrode-side feed conductor 21a, the bonding wires 31, the light-emitting elements 3, and the negative-electrode-side feed conductor 21b, and it further performed from the negative-electrode-side feed terminal 22b to the connector 6. As a result, the respective light-emitting elements 3 covered with the sealing member 27 are simultaneously operated to emit light, and the light-emitting apparatus 1 is used as a planar light source that emits white light.

During this lighting, heat generated from each light-emitting element 3 is mainly conducted to the attachment member 4 from the back surface side of the substrate 2 through the thermally conductive member 8, thereby effecting heat radiation. Moreover, during the lighting of the light-emitting apparatus 1, light traveling toward the substrate 2 side in the light emitted from the light-emitting elements 3 are mainly reflected in a light utilizing direction by the surface of the whitish substrate 2.

Additionally, in a thermo-cycle of on/off the light-emitting elements 3, the substrate 2 repeats thermal expansion and contraction. However, the substrate 2 is held on the attachment member 4 by the elastic pressing force of the mechanical fixing components 5 rather than fixation, for example, screwing. The gap G is formed between the side circumference of the substrate 2 and the side surface 42b of the concave portion 42. As a result, thermal expansion of the substrate 2 can be absorbed by this gap G, and hence it is possible to suppress generation of cracks in the substrate 2 made of ceramics when stress is applied to the substrate 2. Additionally, it is also possible to suppress generation of cracks in the substrate 2 when, for example, tightening force using screws and the like directly acts on the substrate 2.

Further, it is possible to absorb vertical stress and horizontal stress applied to the substrate 2 because of, for example, thermal expansion or vibration of the substrate 2. That is because the substrate 2 is not fixed by, for example, screwing and it is configured to allow movement (free movement) in the vertical direction and the horizontal direction. As a result, damage such as cracks in the substrate 2 can be suppressed.

Furthermore, the thermally conductive member 8 enhances the adhesion of the substrate 2 and the bottom surface 42a of the concave portion 42. Moreover, the thermally conductive member 8 functions to smoothen movement of the substrate 2 in the horizontal direction while improving the adhesion by the viscosity and the flowability of the thermally conductive member 8.

Additionally, the end side of the pressure portion 52 in each mechanical fixing component 5 is in contact with the front surface of the substrate 2 to have the step S on the lower side of the upper surface of the attachment member 4. As a result, the elastic pressing force of the pressure portion 52 effectively acts on the front surface of the substrate 2, and the predetermined elastic pressing force can be maintained across the ages.

Further, for example, if acute corner portions remain in the substrate 2 made of ceramics as they are, the corner portions of the substrate 2 may be easily broken and destroyed when external force is applied because of, for example, impact shock. However, in this embodiment, each corner portion of the substrate 2 has the circular shape and is rounded, breakage due to the external force can be suppressed. For example, when handling the substrate 2 in an assembling operation and the like, the breakage due to the external force can be effectively avoided.

Furthermore, since the free movement of the substrate 2 is allowed in the concave portion 42, the substrate 2 may freely move in the concave portion 42 because of vibration and other factors. Even in such a case, since each corner portion of the substrate 2 has the circular shape, the breakage can be effectively suppressed.

FIG. 10 shows a road lighting unit 10 which is an illumination apparatus having the light-emitting apparatuses 1 arranged therein. The road lighting unit 10 is configured by disposing a lamp fitting 12 to an upper end portion of a column 11. The column 11 is installed alongside a road. A road is illuminated with light emitted from the lamp fitting 12. The light-emitting apparatuses 1 are arranged in the lamp fitting 12. Light from the light-emitting apparatus 1 are radiated through a translucent cover 13.

According to such an illumination apparatus, functions and effects exhibited by the light-emitting apparatus 1 can be realized. Furthermore, in particular, the light-emitting apparatuses 1 are placed in an environment where they easily undergo vibration, but damage to the substrate 2 can be suppressed in this case.

It is to be noted that the present invention is not restricted to the configuration of the foregoing embodiment, and it can be modified in many ways without departing from the gist of the present invention. For example, it is possible to apply a metal base substrate having an insulating layer laminated on one surface of a base plate which has excellent heat conduction properties and is superior in heat radiation properties like aluminum. In this case, an effect of suppressing deformation of the substrate can be expected. Additionally, a solid light-emitting element such as an LED can be applied as the light-emitting element. Further, the number of the light-emitting elements to be mounted is not restricted in particular.

Furthermore, the light-emitting apparatus according to the foregoing embodiment can be incorporated into a road lighting unit, an illumination apparatus for vehicles, a light source as an LED lamp, various kinds of lighting fittings used in or out of doors, or an apparatus main body of a display apparatus and the like, thereby configuring as an illumination apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting apparatus comprising:
   a substrate comprising:
      a first surface side;
      a second surface side; and
      light-emitting elements mounted on the first surface side;
   an attachment member comprising:
      a concave portion comprising:
      an upper surface;
      a side surface facing a circumference of the substrate such that a gap is defined all around the substrate; and
      a bottom surface thermally touching the second surface side of the substrate;
      wherein the concave portion has a depth that does not allow the first surface side of the substrate arranged in the concave portion to project from the upper surface of the concave portion; and
   a mechanical fixing component comprising:
      a base portion fixed on the upper surface of the concave portion; and
      a pressure portion inclined from the base portion toward the bottom surface of the concave portion;
      wherein an end side of the pressure portion is in contact with the first surface side of the substrate at a position closer to the bottom surface than to the upper surface of the concave portion, and the mechanical fixing component is configured to hold the substrate in the concave portion by elastic pressing force of the pressure portion.

2. The apparatus of claim 1, wherein:
   the mechanical fixing component is made of a metal plate-like material having elasticity;
   the pressure portion extends from the base portion; and
   the mechanical fixing component further comprises a protective portion extended parallel to the pressure portion.

3. The apparatus of claim 2, wherein the substrate is made of ceramics and formed into a polygonal shape comprising circular corner portions.

4. The apparatus of claim 1, wherein the substrate is made of ceramics and formed into a polygonal shape comprising circular corner portions.

5. An illumination apparatus comprising:
   an apparatus main body; and
   a light-emitting apparatus arranged in the apparatus main body, the light-emitting apparatus comprising:
   a substrate comprising:
      a first surface side;
      a second surface side; and
      light-emitting elements mounted on the first surface side;
   an attachment member comprising:
      a concave portion comprising:
      an upper surface;
      a side surface facing a circumference of the substrate such that a gap is defined all around the substrate; and
      a bottom surface thermally touching the second surface side of the substrate;
      wherein the concave portion has a depth that does not allow the first surface side of the substrate arranged in the concave portion to project from the upper surface of the concave portion; and
   a mechanical fixing component comprising:
      a base portion fixed on the upper surface of the concave portion; and
      a pressure portion inclined from the base portion toward the bottom surface of the concave portion;
      wherein an end side of the pressure portion is in contact with the first surface side of the substrate at a position closer to the bottom surface than to the upper surface of the concave portion, and the mechanical fixing component is configured to hold the substrate in the concave portion by elastic pressing force of the pressure portion.

6. The apparatus of claim 5, wherein:
   the mechanical fixing component is made of a metal plate-like material having elasticity;
   the pressure portion extends from the base portion; and
   the mechanical fixing component further comprises a protective portion extended parallel to the pressure portion.

7. The apparatus of claim 6, wherein the substrate is made of ceramics and formed into a polygonal shape comprising circular corner portions.

8. The apparatus of claim 5, wherein the substrate is made of ceramics and formed into a polygonal shape comprising circular corner portions.

* * * * *